US012706629B2

(12) United States Patent
Özdemir et al.

(10) Patent No.: US 12,706,629 B2
(45) Date of Patent: Aug. 11, 2026

(54) BIDIRECTIONAL INTERFACE PORT

(71) Applicant: Telefonaktiebolaget LM Ericsson (publ), Stockholm (SE)

(72) Inventors: Ufuk Özdemir, Lund (SE); Kirill Kozmin, Lund (SE); Peter Caputa, Limhamn (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 396 days.

(21) Appl. No.: 18/290,083

(22) PCT Filed: May 12, 2021

(86) PCT No.: PCT/EP2021/062692
§ 371 (c)(1),
(2) Date: Nov. 9, 2023

(87) PCT Pub. No.: WO2022/237981
PCT Pub. Date: Nov. 17, 2022

(65) Prior Publication Data
US 2024/0259043 A1 Aug. 1, 2024

(51) Int. Cl.
*H04B 1/40* (2015.01)
*H03H 11/04* (2006.01)

(52) U.S. Cl.
CPC .......... *H04B 1/40* (2013.01); *H03H 11/0422* (2013.01)

(58) Field of Classification Search
CPC .......... H04B 1/0458; H04B 1/28; H04B 1/40; H04B 1/44; H04B 1/52; H04B 1/58; H04B 17/19
(Continued)

(56) References Cited

U.S. PATENT DOCUMENTS

2004/0212462 A1* 10/2004 Redoute ................ H03H 11/50 333/214
2010/0043045 A1* 2/2010 Shakiba .................. H04B 3/32 725/127
(Continued)

FOREIGN PATENT DOCUMENTS

CN 109525527 A 3/2019
WO 2019/110128 A1 6/2019
WO 2021/233546 A1 11/2021

OTHER PUBLICATIONS

Wu, C. et al., "A 1V 4.2m Fully Integrated 2.5Gb/s CMOS Limiting Amplifier using Folded Active Inductors", IEEE, 2004 (4 pages).
(Continued)

*Primary Examiner* — Ajibola A Akinyemi
(74) *Attorney, Agent, or Firm* — Rothwell, Figg, Ernst & Manbeck, P.C.

(57) ABSTRACT

An interface port (10) for a bidirectional interface is presented. The interface port (10) comprises an input terminal (12) operatively connected to an input of a first active inductor (100), an output terminal (13) operatively connected to an output of a second active inductor (200), and a bidirectional terminal (11) operatively connected to an output of the first active inductor (100) and to an input of the second active inductor (200). Each of the first and second active inductor (100, 200) respectively comprises a forward transconductance stage and a feedback transconductance stage. An associated electric circuitry, electronic apparatus, electric system and a method of control are also disclosed.

20 Claims, 5 Drawing Sheets

(58) Field of Classification Search
USPC ........................................................... 455/73
See application file for complete search history.

(56) References Cited

U.S. PATENT DOCUMENTS

2011/0038286 A1 2/2011 Ta et al.
2017/0187405 A1* 6/2017 Sen .................. H04W 52/0245

OTHER PUBLICATIONS

Kumar, M. et al., "Bi-directional Low Pass Filter and Mixer Design", 2020, (87 pages).
International Search Report and Written Opinion issued in International Application No. PCT/EP2021/062692 issued on Feb. 9, 2022 (13 pages).
Razavi, B., "The Active Inductor", A Circuit for All Seasons, IEEE Solid State Circuits Magazine, vol. 12, No. 2, Apr. 2020 (5 pages).

* cited by examiner

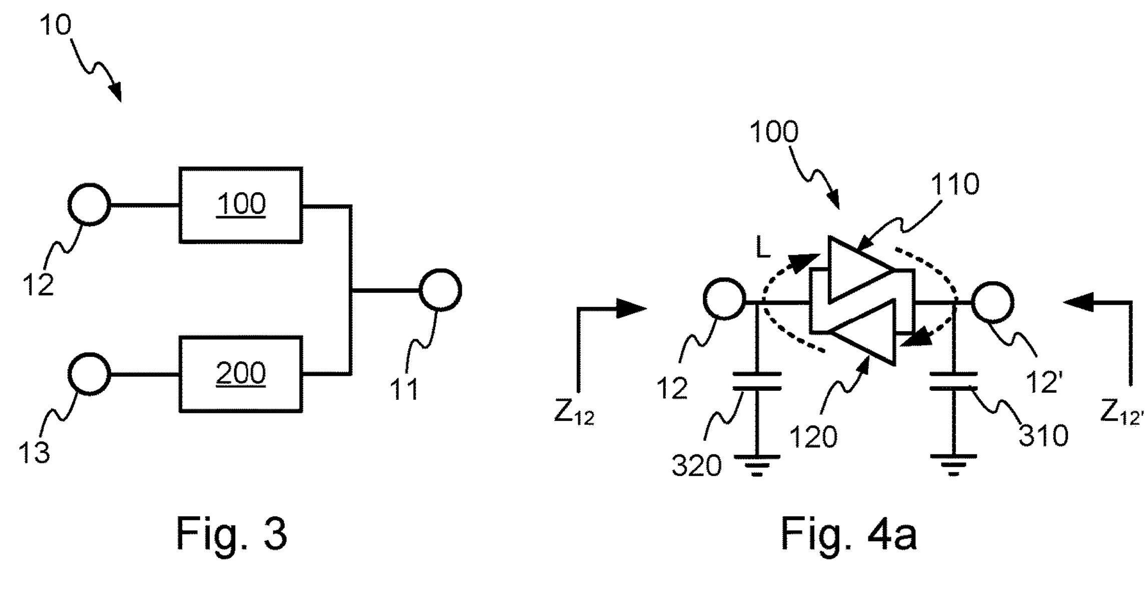
Fig. 3
Fig. 4a
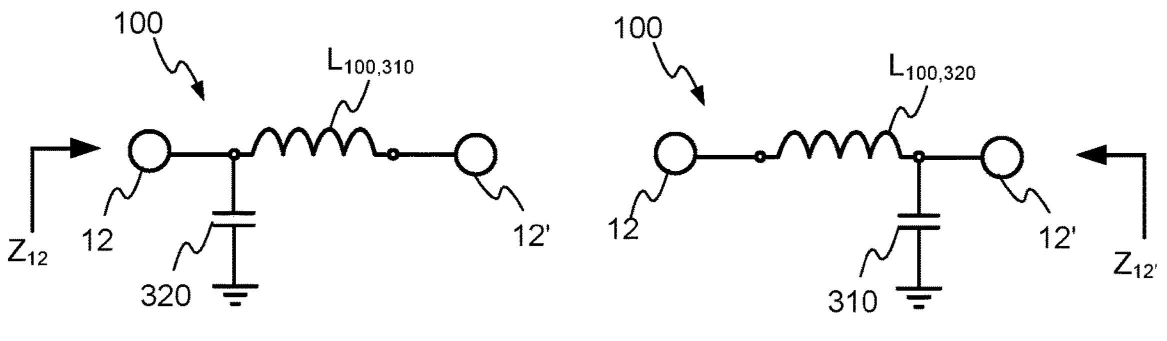
Fig. 4b
Fig. 4c
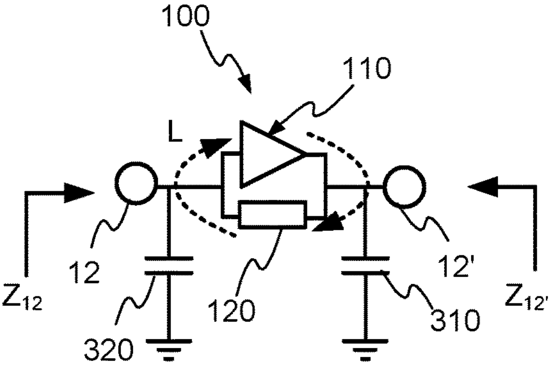
Fig. 5

BIDIRECTIONAL INTERFACE PORT

CROSS REFERENCE TO RELATED APPLICATIONS

This application is a 35 U.S.C. § 371 National Stage of International Patent Application No. PCT/EP2021/062692, filed 2021 May 12.

TECHNICAL FIELD

The present disclosure relates to an interface port and more precisely to a bidirectional interface port implemented by using active inductors.

BACKGROUND

Wireless communication systems usually comprise complex chains of transmitter and receiver circuits, including several frequency conversion steps. The transmitter circuits typically up-convert baseband signals to Radio Frequency, RF, signals for transmission, and the receiver circuits down-convert received RF signals to baseband signals for processing.

These complex chains are commonly split into different blocks depending on signal domain, e.g. digital blocks, mixed signal blocks and RF blocks. For e.g. cost, current consumption and floor plan requirements, the different building blocks are in many implementations integrated into the same Integrated Circuit, IC, or Application Specific Integrated Circuit, ASIC, and the same digital and/or mixed signal block may be utilized to feed one or more RF blocks. Each RF block typically feeds one antenna, and as the complexity of the air interface increases with antenna diversity, interfaces with Multiple Inputs Multiple Outputs, MIMO, and Phased Antenna Arrays, PAA, of current cellular networks, it is beneficial to split the mixed signal blocks from the RF blocks. The interface between the RF blocks and the mixed signal blocks should preferably be a well-defined, robust, highly integrated interface. In order to reduce aliasing of RF signals, the signals transmitted across the interface should preferably be filtered, e.g. with a low pass filter or a band pass filter.

In WO2019/110128, a combined mixer and filter circuitry is disclosed. The combined mixer and filter circuitry comprises a filter comprising an active inductor and a first capacitor providing a low pass filter complex poles having moderate inductor quality factor, Q. Since the filter is combined with the mixer, it re-uses direct currents, DC, of the existing blocks. Consequently, the filter has virtually no current consumption. The interface of the combined mixer and filter circuitry is a current interface.

When physically separated, the interface between the RF blocks and the mixed signal blocks are configured to operate at a common impedance, typically 50Ω single ended, or 100Ω differential. Such an interface is typically single ended and is preferably differential in order to reduce common mode interferences subjected to the interface. It is clear that there will be a need for a significant number of interface ports at both the RF blocks and the mixed signal blocks increasing chip size and requiring complex fan-out layers or wire bonding for efficient routing. Correspondingly, filtering and matching at each port consumes significant amounts of die area, increasing cost and size of ICs and/or ASICs. The interface between the RF blocks and the mixed signal blocks requires new circuitry to compensate for imperfections of the interface, e.g. losses, bandwidth degradation, low load impedance etc. Typically, these imperfections are addressed my means of a Driver circuit and a Receiver circuit. In addition to consuming extra silicon area, these extra circuit blocks consume extra current depending on the length, characteristic impedance and other non-idealities of the interface. Once the imperfections of the interface addressed, the needed signal processing blocks like filtering, sampling, etc. can be applied.

From the above it is understood that there is room for improvements.

SUMMARY

An object of embodiments of the present invention is to provide a new type of interface port which is improved over prior art and which eliminates or at least mitigates the drawbacks discussed above. These objects are achieved by the technique set forth in the appended independent claims with preferred embodiments defined in the dependent claims related thereto.

In a first aspect, an interface port for a bidirectional interface is presented. The interface port comprises an input terminal operatively connected to an input of a first active inductor, an output terminal operatively connected to an output of a second active inductor, and a bidirectional terminal operatively connected to an output of the first active inductor and to an input of the second active inductor. Each of the first and second active inductors respectively comprises a forward transconductance stage and a feedback transconductance stage.

In one variant, at least one feedback transconductance stage of the first active inductor or the second active inductor is a passive feedback transconductance stage. This is beneficial since it further reduces the current consumption and cost of the interface port.

In one variant, the feedback transconductance stage of the first active inductor and the feedback transconductance stage of the second active inductor is a passive feedback transconductance. This is beneficial since it further reduces the current consumption and cost of the interface port.

In one variant, the passive feedback transconductance is a resistor. This is beneficial since it increases the bandwidth and reduces the current consumption and cost of the interface port.

In one variant, the interface port further comprises a substantially capacitive first impedance element operatively connected in parallel to the bidirectional terminal. This is beneficial since it presents a well-defined capacitance to be gyrated into an inductance by the active inductors and also form a well-defined complex pole of a low pass filter presented at the bidirectional terminal.

In one variant, the interface port further comprises a substantially capacitive second impedance element operatively connected in parallel to the input terminal. This is beneficial since the second impedance element will determine a pole of a low pass filter from the input terminal.

In one variant, the interface port further comprising a substantially capacitive third impedance element operatively connected in parallel to the output terminal. This is beneficial since the second impedance element will determine a pole of a low pass filter from the output terminal.

In one variant, the first impedance element, the second impedance element, and the third impedance element have substantially the same impedance. This is beneficial since it will enable transfer functions of the interface port to be substantially equal in both directions.

In one variant, the interface port further comprises a fourth impedance element operatively connected in parallel between the input terminal and the output terminal. This is beneficial since the isolation between the input terminal and the output terminal is increased.

In one variant, the forward transconductance stage of the first active inductor is a p-channel MOSFET based circuitry and the forward transconductance stage of the second active inductor is an n-channel MOSFET based circuitry. This is beneficial since it enables the interface port to be integrated on a standard CMOS process.

In a second aspect, an electric circuitry comprising one or more interface ports according to the first aspect is presented.

In one variant, the electric circuitry is an Integrated Circuit, IC, and at least one bidirectional terminal of said one or more interface ports is operatively connected to an external connection of the IC. Having the interface port integrated in an ASIC is beneficial since it provides the IC with a, cost, area and current efficient bidirectional interface port for signaling across a bidirectional interface.

In a third aspect, an electronic apparatus comprising an electric circuitry according to the second aspect is presented.

In one variant, the electronic apparatus is a wireless communication device for a cellular communication system.

In one variant the, electronic apparatus is a radio base station for a cellular communication system.

In a fourth aspect, an electric system is presented. The electric system comprises a first electric circuitry according to the second aspect, a second electric circuitry according to the second aspect, and a bidirectional interface. The bidirectional interface is arranged to electrically connect the bidirectional terminal of the interface port of the first electric circuitry to the corresponding bidirectional terminal of the interface port of the second electric circuitry.

In one variant, the bidirectional interface is a transmission line. Forming the bidirectional interface as a transmission line is beneficial as it enables the controlled transfer of electromagnetic waves.

In one variant, the transmission line comprises a microstrip and/or a stripline. Microstrips and striplines are beneficial as they provide controlled impedance when connecting e.g. ASICS through a Printed Board Assembly, PCB.

In a fifth aspect, a method of controlling a bidirectional interface is presented. The bidirectional interface connecting a bidirectional terminal of a first interface port according to the first aspect to a bidirectional terminal of a second interface port according to the first aspect. The method comprises, in a first mode of operation, enabling the first active inductor of the first interface port; disabling the second active inductor of the first interface port; enabling the second active inductor of the second interface port; and disabling the first active inductor of the second interface port. The method further comprises, in a second mode of operation, disabling the first active inductor of the first interface port; enabling the second active inductor of the first interface port; disabling the second active inductor of the second interface port; and enabling the first active inductor of the second interface port.

In one variant, the step of enabling comprises activating the forward transconductance stage of the associated active inductor.

In one variant, the step of disabling comprises deactivating the forward transconductance stage of the associated active inductor.

BRIEF DESCRIPTION OF THE DRAWINGS

Embodiments of the invention will be described in the following; references being made to the appended diagrammatical drawings which illustrate non-limiting examples of how the inventive concept can be reduced into practice.

FIG. 3 is a schematic block view of a bidirectional interface port according to embodiments of the invention.

FIGS. 4*a-c* are schematic views of an active inductor according to some embodiments of the invention.

FIG. 5 is a schematic view of an active inductor according to some embodiments of the invention.

DETAILED DESCRIPTION

Hereinafter, certain embodiments will be described more fully with reference to the accompanying drawings. The invention may, however, be embodied in many different forms and should not be construed as limited to the embodiments set forth herein; rather, these embodiments are provided by way of example so that this disclosure will be thorough and complete, and will fully convey the scope of the invention, such as it is defined in the appended claims, to those skilled in the art.

The term "coupled" is defined as connected, although not necessarily directly, and not necessarily mechanically. Two or more items that are "coupled" may be integral with each other. The terms "a" and "an" are defined as one or more unless this disclosure explicitly requires otherwise. The terms "substantially," "approximately," and "about" are defined as largely, but not necessarily wholly what is specified, as understood by a person of ordinary skill in the art. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method that "comprises," "has," "includes" or "contains" one or more steps possesses those one or more steps, but is not limited to possessing only those one or more steps.

Firstly, it should be mentioned that some wireless systems operate in frequency division duplex, FDD, mode, where a transmit path, Tx-path, and a receive path, Rx-path, are active at the same time. In wireless systems operating in time division duplex, TDD, mode only one of the Tx-path or the Rx-path is active at one time. This makes it possible to share some of the hardware blocks in order to increase utilization and reduce cost. Examples of systems where such an architecture is possible are e.g. 2G, TD-CDMA, TD-LTE, 5G High Band, etc.

Figure 1:
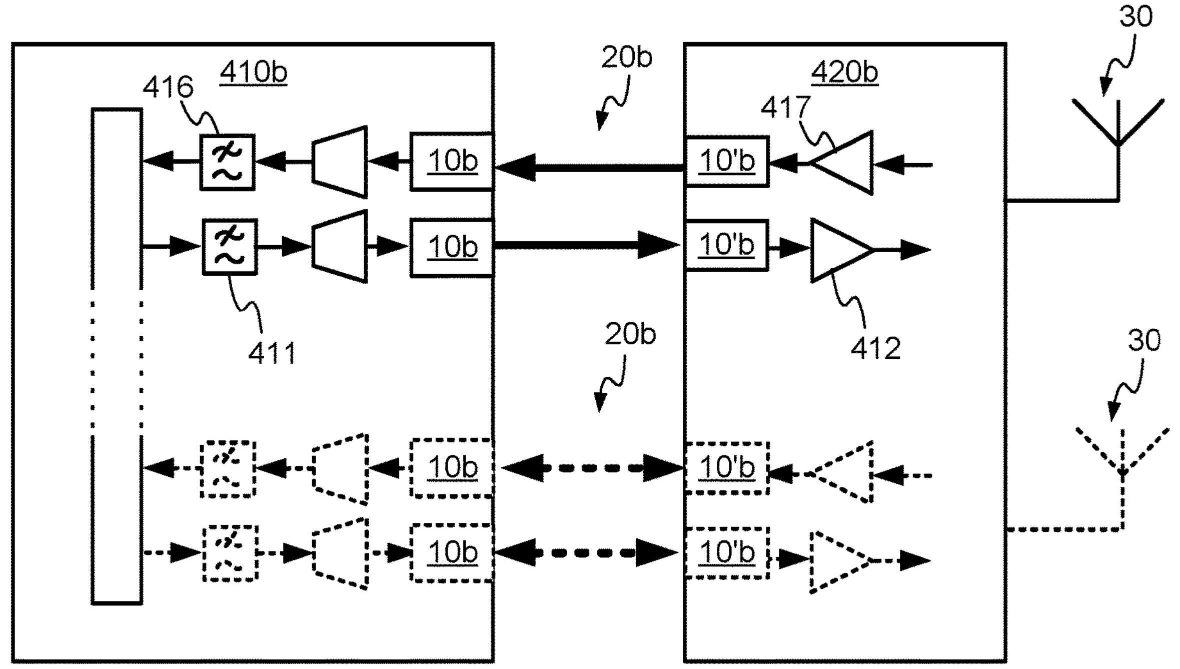
FIG. 1 is a schematic view of a split RF front end according to prior art.

In FIG. 1, a prior art schematic view of a split RF front end is illustrated. The RF front end is split in the sense that a mixed signal block 410*b* is separated from a RF block 420*b*. The RF front end comprises a Tx-path, usually comprising one or more Digital to Analogue Converter, DAC, Transmit Low Pass Filter, Tx-LPF, 411 up-converting Mixer and Power Amplifier, PA, 412 blocks. Similarly, an Rx-path, is substantially the inverse of the Tx-path and comprises one or more Analogue to Digital Converter, ADC, Rx-LPF 416, down-converting Mixer and Low Noise Amplifier, LNA, 417 blocks. The Rx-path and the Tx-path are connected through a single ended interface 20*b* at respective interface ports 10*b* 10'*b* of the mixed signal block 410*b* and the RF block 420*b*.

The interface 20*b* of the split RF front end typically comprise several Tx-paths and Rx-Paths and as previously mentioned, each Rx/Tx-path typically feeds one antenna 30. Multiple Rx/Tx-paths may be utilized to feed e.g. a Phased Antenna Arrays, PAA.

In prior art solutions, analog low pass filters 411, 416 are used as anti-alias filters in both Tx and in Rx. These filters 411, 416 are commonly placed between data converters and frequency converters, i.e. mixers. Usually they are implemented as operational amplifiers, op-amps. with feedback elements generating complex poles to effectively suppress alias frequencies while allowing signals to pass with minimum distortion. Other alternatives are to use active or passive components like inductors, capacitors, and resistors to form these filters. However, most applications require the poles to be complex to reach the required attenuation at the stop band while keeping pass-band droop at a minimum. A real pole will result in 3 dB attenuation at the pole frequency, e.g. if third order filtering is needed to reach the required stop band attenuation, this will result in 9 dB attenuation at the pole frequency, assuming that all poles are at the same frequency, this will result in an unavoidable, significant droop in the passband. Droop may, as the skilled person understands, be described as attenuation, insertion loss etc. and as far as the pass band is concerned, a lower droop is better compared to a higher droop. A real pole/zero has a Q value of 0.5, which means 3 dB deviation at the pole/zero frequency. A complex pole pair has a Q value which, per definition, is greater than 0.5, causing less droop in the pass band. If the Q value is greater than $1/\sqrt{2}$, the frequency response even exhibits a peak in the pass band.

Figure 2:
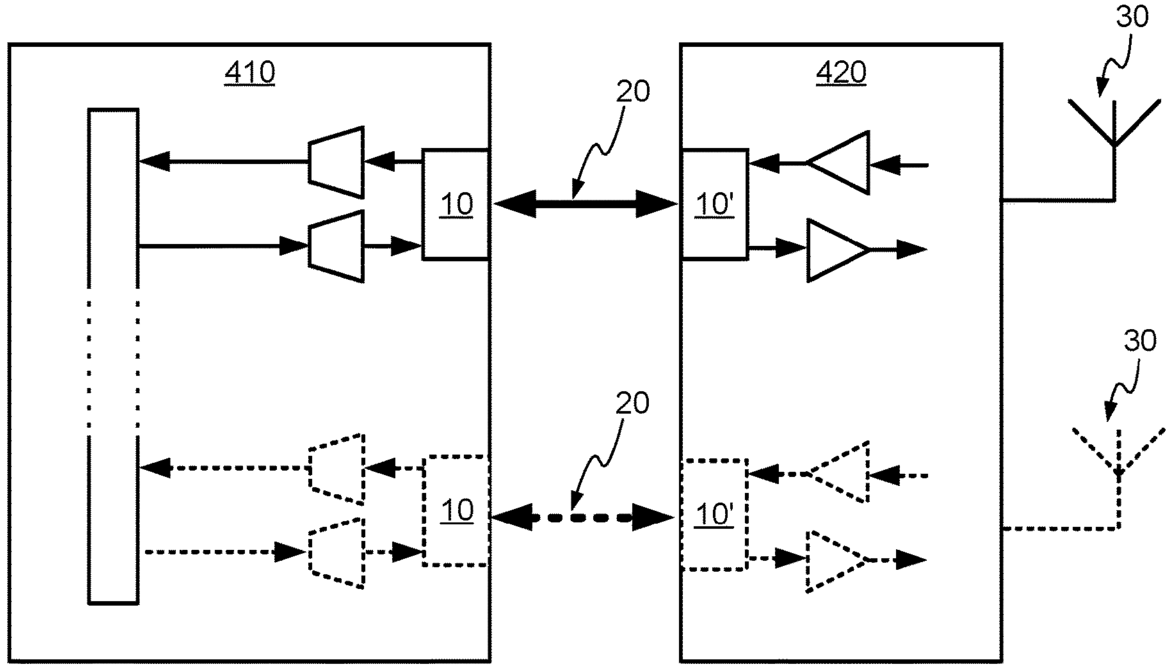
FIG. 2 is a schematic view of a split RF front end according to embodiments of the invention.

Turning now to FIG. 2, a schematic view of a split RF front end according to one embodiment of the invention is illustrated. As in the prior art example of FIG. 1, the RF front end of FIG. 2 is split in the sense that a mixed signal block 410 is separated from a RF block 420. However, as seen when comparing FIG. 1 to FIG. 2, the solution of embodiments of the present invention only comprises one bidirectional interface 20 per Rx/Tx-path, each connected at bidirectional interface ports 10, 10' of the mixed signal block 410 and the RF block 420 respectively. In addition to this, the LPF 411, 416 of the prior art mixed signal block 410*b* are in embodiments of the present invention incorporated in the bidirectional interface ports 10, 10'. Consequently, the stand alone LPFs 411, 416 may be removed from the mixed signal block 410. Albeit illustrated in FIG. 2 as a split RF front end, it should be emphasized that any electric circuitry 410, 420 may comprise the bidirectional interface port 10 of embodiments of the present invention.

FIG. 3 is a block view of the bidirectional interface port 10, or interface port 10 for short, according to embodiments of the invention. The bidirectional interface port 10 comprises a bidirectional terminal 11 for connecting to e.g. the bidirectional interface 20 of FIG. 2. The bidirectional interface ports 10 further comprises an input terminal 12 adapted to receive signals going into the bidirectional interface 20, i.e. out from the bidirectional terminal 11. The input terminal 12 is suitable for connecting to e.g. the Tx-path of the mixed signal block 410 of FIG. 2 or for connecting to the Rx-path of the RF-block 420. Further to this, the bidirectional interface ports 10 comprises an output terminal 13 adapted to output signals going out from the bidirectional interface 20, i.e. into the bidirectional terminal 11. The output terminal 13 is suitable for connecting to e.g. the Rx-path of the mixed signal block 410 of FIG. 2 or for connecting to the Tx-path of the RF-block 420.

The bidirectional interface ports 10 further comprises a first active inductor 100 operatively connected between the input terminal 12 and the bidirectional terminal 11 and a second active inductor 200 operatively connected between the output terminal 13 and the bidirectional terminal 11.

An active inductor 100, 200 is an electric circuitry, typically without any physical inductor component, e.g. a coil. The impedance of the active inductor 100, 200 will increases with frequency within a certain frequency range, which is the corresponding behavior of a physical inductor. The active inductor 100, 200 may be modelled as a gyrator used to transform a load capacitance into an inductance, i.e. rotating the impedance of the load capacitance substantially 90°. In the following, active inductors according to embodiments of the invention will be described mainly with reference to the first active inductor 100. However, the same reasoning applies to the second active inductor 200.

In FIG. 4*a*, an active inductor 100 is illustrated as comprising a forward transconductance stage 110 and a feedback transconductance stage 220. The forward transconductance stage 110 and the feedback transconductance stage 120 are connected to form a loop L illustrated by a dashed line in FIG. 4*a*. The loop L constitutes a gyrator. The forward transconductance stage 110 has a first transconductace $g_{m1}$ and the feedback transconductance stage 220 has a second transconductance $g_{m2}$, each determined by Eqn. 1 below.

$$g_{m,n} = I_{out,n}/V_{in,n} \qquad \text{Eqn. 1}$$

The schematic of 4*a* further comprise a first impedance element 310 connected in parallel between an output terminal 12' of the first active inductor 100 and ground. The impedance element 310 is gyrated, i.e. rotated 90°, by the active inductor 100 when considering an input impedance $Z_{12}$ of the input port 12. Analogously, a second impedance element 320 connected between the input terminal 12 and ground that is gyrated by the active inductor 100 when considering an input impedance $Z_{12}$ of the output terminal 12'.

Turing to FIGS. 4*b* and 4*c*, simplified equivalent circuit diagrams of the active inductor 100 are shown from the input terminal 12, FIG. 4*b*, and the output terminal 12' of the first active inductor 100, FIG. 4*c*, respectively. In FIG. 4*b*, the first impedance element 310 is gyrated to form a first gyrated inductor $L_{100,310}$ and in FIG. 4*c*, the second impedance element 320 is gyrated to form a second gyrated inductor $L_{100,320}$. It should be noted that albeit illustrated as capacitors 310, 320, the first and second impedance elements 310, 320 may very well be inductors 310, 320 that are gyrated into capacitors. As is clear from FIGS. 4*b* and 4*c*, the input impedances $Z_{12}$ and $Z_{12'}$ will have a low pass characteristics formed by the impedance element arranged 320, 310 at the respective terminal 12, 12' and the gyration of the respective impedance elements $L_{100,320}$, $L_{100,310}$ of the opposite terminal 12', 12.

The first impedance element 310 and/or the second impedance element 320 are not necessarily physical components or circuits, but may be formed by e.g. parasitic effects. As a specific example, if the forward transdconductance stage 110 is implemented using one or more Metal Oxide Semiconductors, MOS, the second impedance element 320 may be a gate to source capacitance $C_{gs}$ of the MOS. The same reasoning applies to the feedback transd-conductance stage 120.

If the first impedance element 310 and the second impedance element 320 are chosen to have the same impedance, a transfer function H(s) of the active inductor 100 will be commutative, i.e. the transfer function from the input port 12 to the output port 12' of the first active inductor 100 will be the same as the transfer function from the output port 12' to the input port 12 of the first active inductor 100. This is under the assumption that the first transconductace $g_{m1}$ and the second transconductance $g_{m2}$ are substantially equal.

It should be emphasized that, historically, active inductors 100, 200 are not constructed in the bidirectional form as illustrated in FIG. 4*a* with both a first impedance element 310 and second impedance element 320 being gyrated.

In FIG. 5, a schematic view of the first active inductor 100 is shown according to one embodiment of the invention. The feedback transconductance stage 120 is in this embodiment realized by means of a passive component 120. The passive component 120 may be any suitable passive component 120, but in order to maximize the bandwidth of the feedback transconductance stage 120, the feedback transconductance stage 120 may be realized by a substantially resistive impedance element 120, preferably a resistor 120. Having the feedback transconductance stage 120 in the form of a resistor 120 makes the active inductor 100, 200 robust compared to e.g. op-amp based solutions as no feedback loops, neither differential or common mode, are present, thus eliminating any stability issues. Needless to say, a signal bandwidth of a feedback transconductance stage 120 in the form of a resister 120 vastly exceeds a corresponding feedback transconductance stage 120 in the form of an op-amp.

Figure 6A:
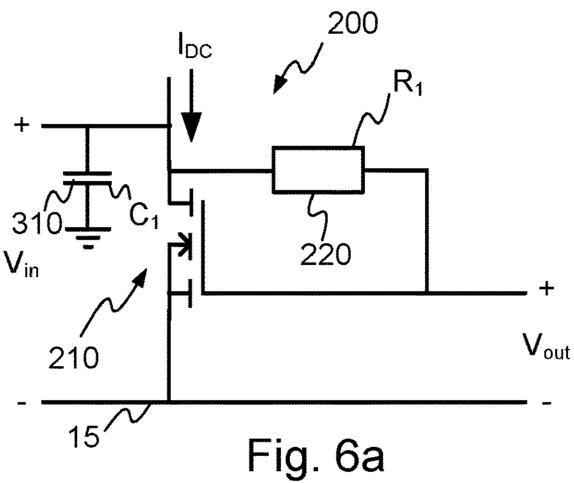
FIGS. 6*a-d* are simplified electric circuit diagrams of active inductors according to some embodiments of the invention.
Figure 6B:
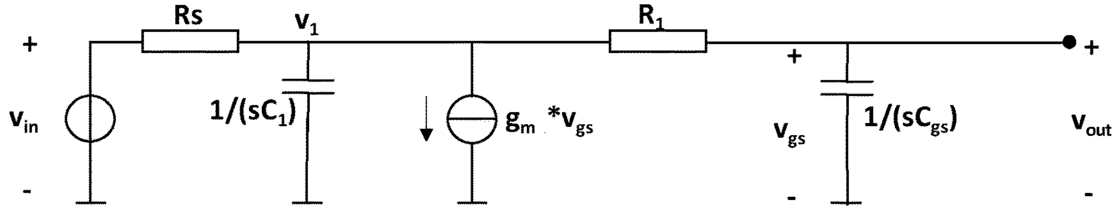

With reference to FIGS. 6*a* and 6*b*, the transfer function H(s) of the second active inductor 200 according to embodiments of the present invention will be described. Starting with FIG. 6*a*, a simplified schematic of the second active inductor 200 implemented using an N-MOS transistor as the forward transconductance stage 210 is shown. As the skilled person will appreciate after digesting the teachings herein, this implementation is but one example that is used to exemplify the second active inductor 200. As will be illustrated later with reference to FIGS. 6*c* and 6*d*, the same reasoning applies to the first active inductor 100, and as the skilled person will understand at least from FIG. 8, that the usage of a P-MOS transistor may be preferred in such an implementation. In FIG. 6*a*, a biasing current $I_{DC}$ is feed to a drain of the forward transconductance stage 210 and an input voltage $V_{in}$ is applied across the drain and a source of the forward transconductance stage 210. The feedback transconductance stage 220 is realized as a passive element 220 in the form of a resistor 220 having a resistance $R_1$. Between the drain of the forward transconductance stage 210 and ground, the first impedance element 310 is connected which, in this example, has a capacitance $C_1$. An output voltage $V_{out}$ is provided across a gate and the source of the forward transconductance stage 210. The positive terminal of the output voltage $V_{out}$ is the output terminal 13, as illustrated in FIG. 3, and the positive terminal of the input voltage $V_{in}$ is the common terminal 11 of FIG. 3.

In FIG. 6*b*, the small signal schematics of the schematics of FIG. 6*a* is shown. The small signal input voltage $v_{in}$ is provided from a voltage source having a source resistance $R_s$. An intermittent voltage $v_1$ is defined across the first impedance element 310 having an impedance in a frequency domain of $1/sC_1$. This is arranged in parallel with a current drain of $g_m \cdot v_{gs}$, where $v_{gs}$ is the voltage across the gate and source of the forward transconductance stage 210, i.e. $v_{out}$. The transconductance $g_m$ of FIG. 6*b* is actually the second transconductance $g_{m2}$. The output voltage $v_{out}$ is provided across a gate source capacitance $C_{gs}$ of the forward transconductance stage 210 having an impedance of $1/sC_{gs}$. The gate source capacitance $C_{gs}$ is connected to the current drain by the passive element of the feedback transconductance stage 220, embodied in FIG. 6*b* in the form of a resistor having a resistance $R_1$. The transfer function H(s) of the second active inductor 200 of the simplified small signal schematic in FIG. 6*b*, may be derived as illustrated in the steps:

$$Vgs = Vout \qquad \text{Eqn. 2}$$

$$\left(\frac{V1 - Vs}{R_s}\right) + \left(\frac{V1}{1/sC_{gs}}\right) + gm \cdot Vgs + \left(\frac{V1 - Vout}{R_1}\right) = 0 \qquad \text{Eqn. 3}$$

$$\left(\frac{Vout - V1}{R_1}\right) + \left(\frac{Vout}{1/sC_{gs}}\right) = 0 \qquad \text{Eqn. 4}$$

Rewriting Eqn. 4 will provide Eqn. 5

$$\left(\frac{Vout - V1}{R_1}\right) + \left(\frac{Vout \cdot sC_{gs}}{1}\right) = 0 \rightarrow Vout \cdot (1 + sC_{gs}R_1) = V1 \qquad \text{Eqn. 5}$$

Rewrite Eqn. 3 by substituting Eqn. 2:

$$\left(\frac{V1 - Vs}{R_s}\right) + \left(\frac{V1 \cdot sC_1}{1}\right) + \left(\frac{gm \cdot Vout}{1}\right) + \left(\frac{V1 - Vout}{R_1}\right) = 0 \qquad \text{Eqn. 6}$$

Equalize denominators to $R_1 \cdot R_s$:

$$V_1 \cdot R_1 - V_s \cdot R_1 + V_1 sC_1R_1R_s + V_{out}gmR_1R_s + V_1R_s - V_{out}R_s = 0 \qquad \text{Eqn. 7}$$

Rewrite above in terms of $V_1$, $V_{out}$ and $V_{in}$:

$$V_1(R_1 + R_s + sC_1R_1R_s) + V_{out}(gmR_1R_s - R_s) = V_s \cdot R_1 \qquad \text{Eqn. 8}$$

Insert Eqn. 5 into Eqn. 8:

$$V_{out} \cdot (1 + sC_{gs}R_1) \cdot (R_1 + R_s + sC_1R_1R_s) + V_{out}(gmR_1R_s - R_s) == V_s \cdot R_1 \qquad \text{Eqn. 9}$$

-continued

Rewrite Eqn. 9:

$$V_{out}\cdot\big(R_1+\cancel{R_s}+sC_1R_1R_s+sC_{gs}R_1^2+sC_{gs}R_1R_s+s^2C_1C_{gs}R_1^2R_S+gmR_1R_S-\cancel{R_s}=V_S\cdot R_1 \qquad \text{Eqn. 10}$$

The transfer function H(s) may now be written as:

$$H(S)=\frac{V_{out}}{V_s}=\frac{R_1}{\big(R_1+sC_1R_1R_s+sC_{gs}R_1^2+sC_{gs}R_1R_s+s^2C_1C_{gs}R_1^2R_s+gmR_1R_s\big)} \qquad \text{Eqn. 11}$$

By dividing the transfer function H(s) with $R_1$, it is rewritten in standard form:

$$H(S)=\frac{1}{S^2(C_1C_{gs}R_1R_s)+S(C_1R_s+C_{gs}R_1+C_{gs}R_s)+1+gmR_s} \qquad \text{Eqn. 12}$$

Divide by ($1+gmR_s$) to arrive at bi-quad standard form:

$$H(S)=\frac{1/(1+gmR_s)}{S^2\left(\frac{C_1C_{gs}R_1R_s}{1+gmR_s}\right)+S\left(\frac{C_1R_s+C_{gs}R_1+C_{gs}R_s}{1+gmR_s}\right)+1} \qquad \text{Eqn. 13}$$

By utilizing Eqn. 14 below, it is possible to isolate a pole frequency $\omega_0$ of the filter, Eqn. 15, and the Q factor of the filter, Eqn. 16.

$$H(S)=\frac{N(S)}{S^2\left(\frac{1}{\omega_0^2}\right)+S\left(\frac{1}{Q\omega_0}\right)+1} \qquad \text{Eqn. 14}$$

$$\frac{1}{\omega_0^2}=\frac{C_1C_{gs}R_1R_s}{1+gmR_s}\to\omega_0=\sqrt{\frac{1+gmR_s}{C_1C_{gs}R_1R_s}} \qquad \text{Eqn. 15}$$

$$\frac{1}{Q\omega_0}=\frac{C_1R_s+C_{gs}R_1+C_{gs}R_s}{1+gmR_s}\to Q=\frac{1+gmR_s}{(C_1R_s+C_{gs}R_1+C_{gs}R_s)}\cdot\sqrt{\frac{C_1C_{gs}R_1R_s}{1+gmR_s}}\to Q=\frac{\sqrt{(1+gmR_s)\cdot C_1C_{gs}R_1R_s}}{(C_1R_s+C_{gs}R_1+C_{gs}R_s)} \qquad \text{Eqn. 16}$$

As seen in Eqn. 13 above, the transfer function H(s) has no zeroes ensuring high bandwidth and the complex poles are specified by the third impedance element 330, if present otherwise $C_{gs}$, the first impedance element 310 and capacitance of the forward transconductance 110 and the feedback transconductance 120. In summary, the transfer function H(s) provide an efficient LPF.

Figure 6C:
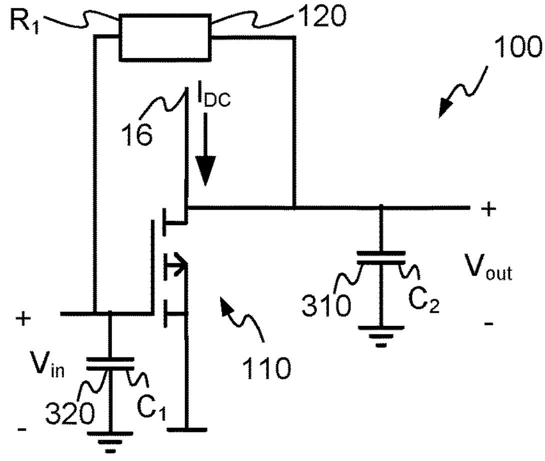
Figure 6D:
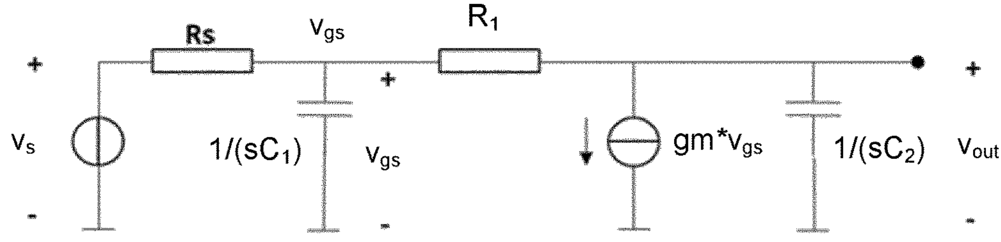

FIGS. 6*c* and 6*d* correspond to FIGS. 6*a* and 6*b* but describe the first active inductor 100. In FIG. 6*c*, a biasing current $I_{DC}$ is feed to a drain of the forward transconductance stage 110 and an input voltage $V_{in}$ is applied to the gate of the forward transconductance stage 110, corresponding to the input terminal 12 of FIG. 3, where the second impedance element 320 having a capacitance of $C_1$ is connected. The feedback transconductance stage 120 is realized as a passive element 120 in the form of a resistor 120 having a resistance $R_1$. An output voltage $V_{out}$ is provided at the drain of the forward transconductance stage 110 and one side of the resistor 120 forming the common terminal 11 which also connects the first impedance element 310 having a capacitance $C_2$.

In FIG. 6*d*, the small signal schematics of the schematics of FIG. 6*c* is shown. The small signal input voltage $v_s$ is provided from a voltage source having a source resistance $R_s$. An intermittent voltage $v_{gs}$ is defined across the second impedance element 320 having an impedance in a frequency domain of $1/sC_1$. This is connected via the feedback transconductance 120, i.e. $R_1$ to an output voltage $v_{out}$ which is provided across a current drain of $g_m\cdot v_{gs}$, where $v_{gs}$ is the voltage across the gate and source of the forward transconductance stage 110, i.e. $v_{out}$ and the first impedance element 310 having an impedance in a frequency domain of $1/sC_2$. The transfer function H(s) of the first active inductor 100 of the simplified small signal schematic in FIG. 6*d*, may be derived as illustrated in the steps:

$$\left(\frac{\mathrm{V}gs-\mathrm{V}s}{R_s}\right)+\left(\frac{\mathrm{V}gs}{1/sC_1}\right)+\left(\frac{\mathrm{V}gs-\mathrm{V}out}{R_1}\right)=0 \qquad \text{Eqn. 17}$$

$$\left(\frac{\mathrm{V}out-\mathrm{V}gs}{R_1}\right)+gm\cdot\mathrm{V}gs+\left(\frac{\mathrm{V}out}{1/sC_2}\right)=0 \qquad \text{Eqn. 18}$$

Rewrite Eqn. 18:

$$\left(\frac{\mathrm{V}out-\mathrm{V}gs}{R_1}\right)+\left(\frac{gm\cdot\mathrm{V}gs}{1}\right)+\left(\frac{\mathrm{V}out\cdot sC_2}{1}\right)=0\to\mathrm{V}out\cdot(1+sC_2R_1)=\mathrm{V}gs\cdot(1-gmR_1) \qquad \text{Eqn. 19}$$

$$\mathrm{V}gs=\mathrm{V}out\cdot\frac{(1+sC_2R_1)}{(1-gmR_1)} \qquad \text{Eqn. 20}$$

Rewrite Eqn. 17:

$$\left(\frac{\mathrm{V}gs-\mathrm{V}s}{R_s}\right)+\left(\frac{\mathrm{V}gs\cdot sC_1}{1}\right)+\left(\frac{\mathrm{V}gs-\mathrm{V}out}{R_1}\right)=0 \qquad \text{Eqn. 21}$$

Equalize denominators to $R_1\cdot R_s$:

$$\mathrm{V}_{gs}\cdot R_1-\mathrm{V}_s\cdot R_1+\mathrm{V}_{gs}sC_1R_1R_s+\mathrm{V}_{gs}R_s-\mathrm{V}_{out}R_s=0 \qquad \text{Eqn. 22}$$

Rewrite Eqn. 22 in terms of $V_1$, $V_{out}$ and $V_s$:

$$\mathrm{V}_{gs}(R_1+sC_1R_1R_s+R_s)-\mathrm{V}_{out}\cdot R_s=\mathrm{V}_s\cdot R_1 \qquad \text{Eqn. 23}$$

Insert Eqn. 20 into Eqn. 23:

$$Vout\cdot\frac{(1+sC_2R_1)}{(1-gmR_1)}\cdot(R_1+sC_1R_1R_s+R_s)-V_{out}\cdot R_s=V_s\cdot R_1 \Leftrightarrow V_{out}\cdot\big(R_1+sC_1R_1R_s+R_s+sC_2R_1^2+s^2C_1C_2R_1^2R_s+sC_2R_1R_s-R_s+gmR_1R_s\big)=V_s\cdot R_1\cdot(1-gmR_1) \qquad \text{Eqn. 24}$$

The transfer function H(s) may now be written as:

$$H(S) = \frac{V_{out}}{V_s} = \frac{R_1 \cdot (1 - gmR_1)}{\left(R_1 + sC_1R_1R_s + sC_2R_1^2 + sC_2R_1R_s + s^2C_1C_2R_1^2R_s + gmR_1R_s\right)} \quad \text{Eqn. 25}$$

Divide all by $R_1$ and rewrite in standard form:

$$H(S) = \frac{1}{S^2(C_1C_2R_1R_s) + S(C_1R_s + C_2R_1 + C_2R_s) + 1 + gmR_s} \quad \text{Eqn. 26}$$

Divide by ($1+gmR_s$) to arrive at bi-quad standard form:

$$H(S) = \frac{(1 - gmR_1)/(1 + gmR_s)}{S^2\left(\frac{C_1C_2R_1R_s}{1 + gmR_s}\right) + S\left(\frac{C_1R_s + C_2R_1 + C_2R_s}{1 + gmR_s}\right) + 1} \quad \text{Eqn. 27}$$

By utilizing Eqn. 28 below, it is possible to isolate a pole frequency $\omega_0$ of the filter, Eqn. 29, and the Q factor of the filter, Eqn. 30.

$$H(S) = \frac{N(S)}{S^2\left(\frac{1}{\omega_0^2}\right) + S\left(\frac{1}{Q\omega_0}\right) + 1} \quad \text{Eqn. 28}$$

$$\frac{1}{\omega_0^2} = \frac{C_1C_2R_1R_s}{1 + gmR_s} \rightarrow \omega_0 = \sqrt{\frac{1 + gmR_s}{C_1C_2R_1R_s}} \quad \text{Eqn. 29}$$

$$\frac{1}{Q\omega_0} = \frac{C_1R_s + C_2R_1 + C_2R_s}{1 + gmR_s} \rightarrow Q = \frac{1 + gmR_s}{(C_1R_s + C_2R_1 + C_2R_s)} \cdot \sqrt{\frac{C_1C_2R_1R_s}{1 + gmR_s}} \rightarrow Q = \frac{\sqrt{(1 + gmR_s) \cdot C_1C_2R_1R_s}}{(C_1R_s + C_2R_1 + C_2R_s)} \quad \text{Eqn. 30}$$

As seen in Eqn. 27 above, also this transfer function H(s) is without zeroes ensuring high bandwidth and the complex poles are specified by the second impedance element 320, the first impedance element 310 and capacitance of the forward transconductance 110 and the feedback transconductance 120. In summary, also this transfer function H(s) provide an efficient LPF.

The skilled person will further appreciate that the high bandwidth that is inherent to the active inductor 100, 200 of embodiments of the present invention comes without having to trade off current consumption for bandwidth. Further to this, the active inductors 100, 200 of embodiments of the present invention offers an impedance matched interface in which an input port impedance is determined as $Z_{IN}=1/g_m$, which, in a preferred embodiment is tuned to substantially 50Ω single ended or 100Ω differential.

The DC gains of the small signal circuits of FIGS. 6*b* and 6*d* may be described by their respective nominator functions N(s), which for the first active inductor 100 is written as $(1-gmR_1)/(1+gmR_s)$, Eqn. 27. It should be noted that, as $R_1$ typically is greater than $R_s$, the DC gain of the first active inductor 100 is negative.

As understood, the active inductors 100, 200 of the present disclosure are bidirectional, and if dimensioned appropriately, the transfer functions H(s) will be the same in both directions. However, when used in applications where there is a need for isolation between a transmit and a receive side of a bidirectional interface 20, such as the split RF front end illustrated in FIG. 2, this isolation is preferably provided at the connection of the transmit and a receive side to the bidirectional interface 20. This isolation may be provided by e.g. switches or duplexers if Frequency Division Duplex, FDD is utilized. However, as indicated in reference to FIG. 3, the inventors behind this disclosure have realized that, by combining two active inductors 100, 200, it is possible to form a bidirectional interface port 10 with separate transmit and receive and paths, effectively incorporating switching between transmit and receive and thereby providing good isolation between the transmit path and the receive path.

Figure 7:
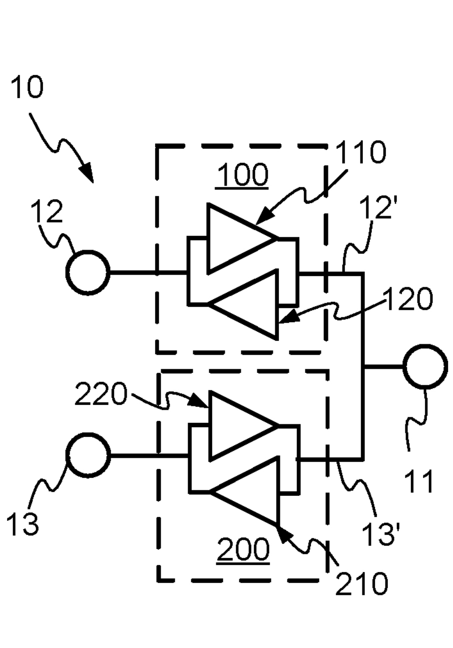
FIG. 7 is a schematic view of a bidirectional interface port according to some embodiments of the invention.

The inventive interface port 10 is illustrated according to one embodiment in FIG. 7. In order to isolate the input terminal 12 of the first active inductor 100 from the output terminal 13 of the second active inductor, the output terminal 12' of the first active inductor 100 in coupled to a corresponding output terminal 13' of the second active inductor 200, forming the bidirectional terminal 11. By activation of either the first active inductor 100 or the second active inductor 200, a direction of the bidirectional terminal 11 may be controlled. The end result is an interface port 10 combining impedance matching, switching, multiplexing and filtering functions in one, thereby greatly reducing current consumption and area of the design. The interface port 10 is simple in design and self-biased as no bias voltages and/or reference currents etc. are needed.

Figure 8:
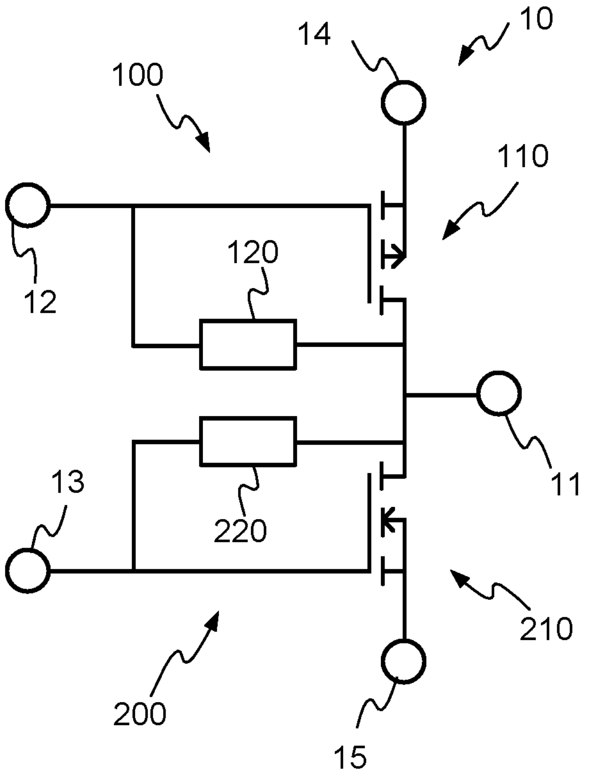
FIG. 8 is a simplified electric circuit diagram of a bidirectional interface port according to some embodiments of the invention.

In FIG. 8, the interface port 10 according to one embodiment is illustrated comprising active inductors 100, 200 wherein the forward transconductances 110, 210 are MOS components and the feedback transconductances 120, 220 are passive elements, preferably substantially resistive passive elements 120, 220. The forward transconductance 110 of the first active inductor 100 is connected to a positive terminal 14 for receiving a positive power and the forward transconductance 210 of the second active inductor 200 is connected to a negative terminal 15 for receiving a negative power. The terms positive and negative are not to be limited to absolutely positive or negative, but may be considered relative in that one power is positive in relation to the other power or vice versa. It should be noted that albeit the interface port 10 of FIG. 8 is illustrated with both feedback transconductances 120, 220 being passive elements, some embodiments may be formed with only one of the feedback transconductances 120, 220 being passive elements 120, 220. As the forward transconductance 110 of the first active inductor 100 is connected to the positive terminal 14, the forward transconductance 110 of the first active inductor 100 is preferably implemented based on P-MOS circuitry. Analogously, as the forward transconductance 210 of the second active inductor 200 is connected to the negative terminal 15, the forward transconductance 210 of the second active inductor 200 is preferably implemented based on N-MOS circuitry.

The interface port 10 may be controller to either connect the input terminal 12 to the bidirectional terminal 11, or to connect the output terminal 13 to the bidirectional terminal 11. In order to connect the input terminal 12 to the bidirectional terminal 11, the forward transconductance stage 110 of the first active inductor 100 is activated, and the forward transconductance stage 210 of the second active inductor 200 is deactivated. Analogously, the output terminal 13 may be connected to the bidirectional terminal 11 by activating the forward transconductance stage 210 of the second active inductor 200 and deactivating the forward transconductance stage 110 of the first active inductor 200. The activation of the forward transconductance stage 110 of the first active inductor 100 may comprise supplying power to the positive terminal 14, and consequently deactivation of the forward transconductance stage 110 of the first active inductor 100 may comprise removing power from the positive terminal 14. Similarly, activation of the forward transconductance stage 210 of the second active inductor 200 may comprise supplying power to the negative terminal 15, and consequently deactivation of the forward transconductance stage 210 of the second active inductor 200 may comprise removing power from the negative terminal 15. The supply of power to the supply terminals 14, 15 may be controlled through switches (not shown) arranged in series with either supply terminal 14, 15.

A further benefit of embodiments wherein the active inductors are implemented using N-MOS and/or P-MOS circuitry is that these are compatible with standard digital CMOS processes used in many digital circuitries. As a result, it will work at very low supply voltages in the smallest process nodes. The simple inverter-like building block of the interface port 10 is easily used by designers of digital or mixed signal circuitry shortening development time and thereby reducing design cost.

Figure 9:
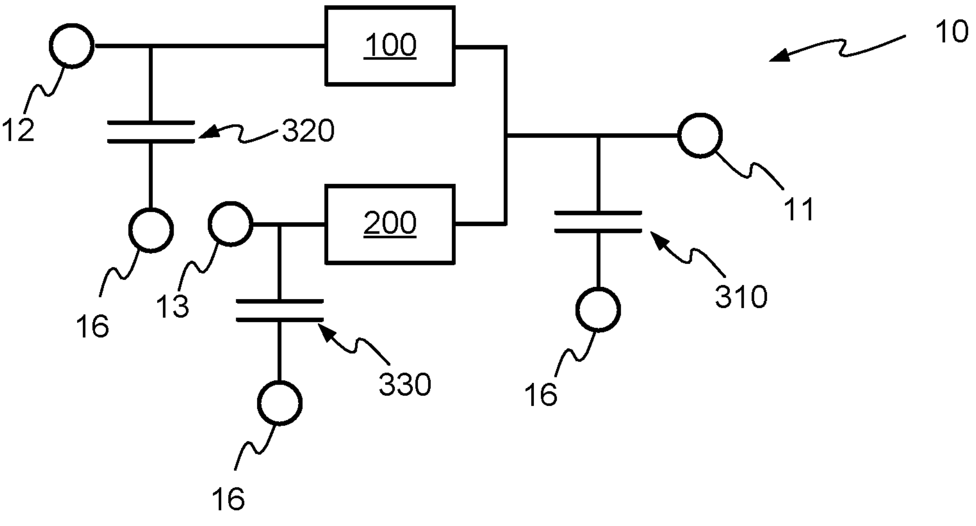
FIG. 9 is a schematic view of a bidirectional interface port according to some embodiments of the invention.
Figure 10:
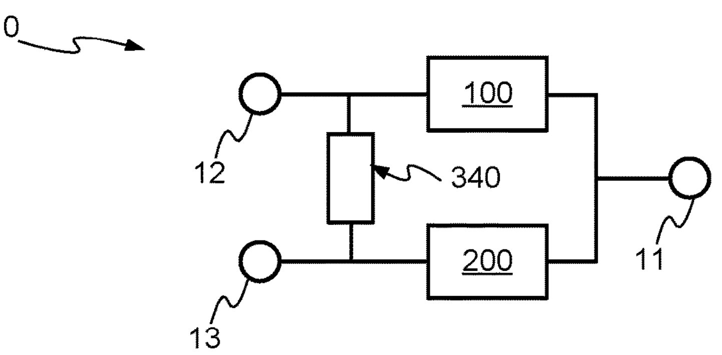
FIG. 10 is a schematic view of a bidirectional interface port according to some embodiments of the invention.

In FIG. 9, a further embodiment of the interface port 10 is illustrated. The interface port 10 is, in this embodiment, provided with the first impedance element 310 connected between the bidirectional terminal 11 and a reference terminal 16. The reference terminal may be a terminal having any suitable potential, preferably a ground potential and/or the same potential as the negative terminal 15. The second impedance element 320 is connected between the input port 12 and the reference terminal 16; and a third impedance element 330 is connected between the output terminal 13 and a reference terminal 16. It should be emphasized that, although illustrated with all impedance elements 310, 320, 330 provided, simply using only one or two of the impedance elements 310, 320, 320 will also result in workable embodiments of the present invention. The impedance elements 310, 320, 330 are, as previously discussed, preferably substantially capacitive impedance elements 310, 320, 330. The benefit of having at least one of the impedance elements 310, 320, 330 is that the gyrated capacitance and/or the capacitance of the LPF can be chosen more freely and the designer does not have to rely on e.g. parasitic effects and/or $C_{gs}$ etc. In a preferred embodiment, at least one of the impedance elements 310, 320, 330 is a tunable and/or switchable capacitor 310, 320, 330 enabling selectively controlling the inductance, via the gyrated first impedance element 310 and/or the LPF characteristics via the second impedance element 320 or the third impedance element 330. This effectively makes it possible to control the bandwidth of the interface port 10.

As mentioned earlier, embodiments of the present invention offer good isolation between the input terminal 12 and the output terminal 13. The most important is the leakage from the, typically higher power, input terminal 12, to the more sensitive output terminal 13. In order to further improve the isolation between these terminals 12, 13, the inventors have realized that the introduction of a suitable fourth impedance element 340 connected between the input terminal 12 and the output terminal 13 further improves isolation. The fourth impedance element 340 is dimensioned to reduce the leakage from the input terminal 12 to the output terminal 13 when the input terminal 12 is connected to the bidirectional terminal 11. This leakage will be via the feedback transconductance stage 220 of the second active inductor 200 and will be most significant when the feedback transconductance stage 220 of the second active inductor 200 is implemented as a resistor. However, as the forward transconductance stage 110 of the first active inductor 100 will rotate a signal provided at the input terminal 12 by 180° before it arrives at the output terminal 13, the fourth impedance element 340 will effectively couple an in-phase portion of the signal to the output terminal 13, effectively cancelling the leaked, phase shifted signal. The skilled person will, after digesting this disclosure, understand how to dimension the fourth impedance element 340 based on the feedback transconductance stage 220 of the second active inductor 200 and the forward transconductance stage 110 of the first active inductor 100. If e.g. the second active inductor 200 is implemented as illustrated in FIG. 6*a*, the fourth impedance element 340 may be designed to substantially correspond to $R_1$ and a drain source capacitance $C_{ds}$ of the disabled N-MOS of the forward transconductance 210 of the second active inductor 200. Albeit described as improving leakage from the input terminal 12 to the output terminal 13, the disclosed fourth impedance element 340 will be just as efficient in cancelling leakage from the output terminal 13 to the input terminal. This is true at least if the first and second inductors 100, 200 are implemented in, from a small signal perspective, substantially the same way.

Figure 11:
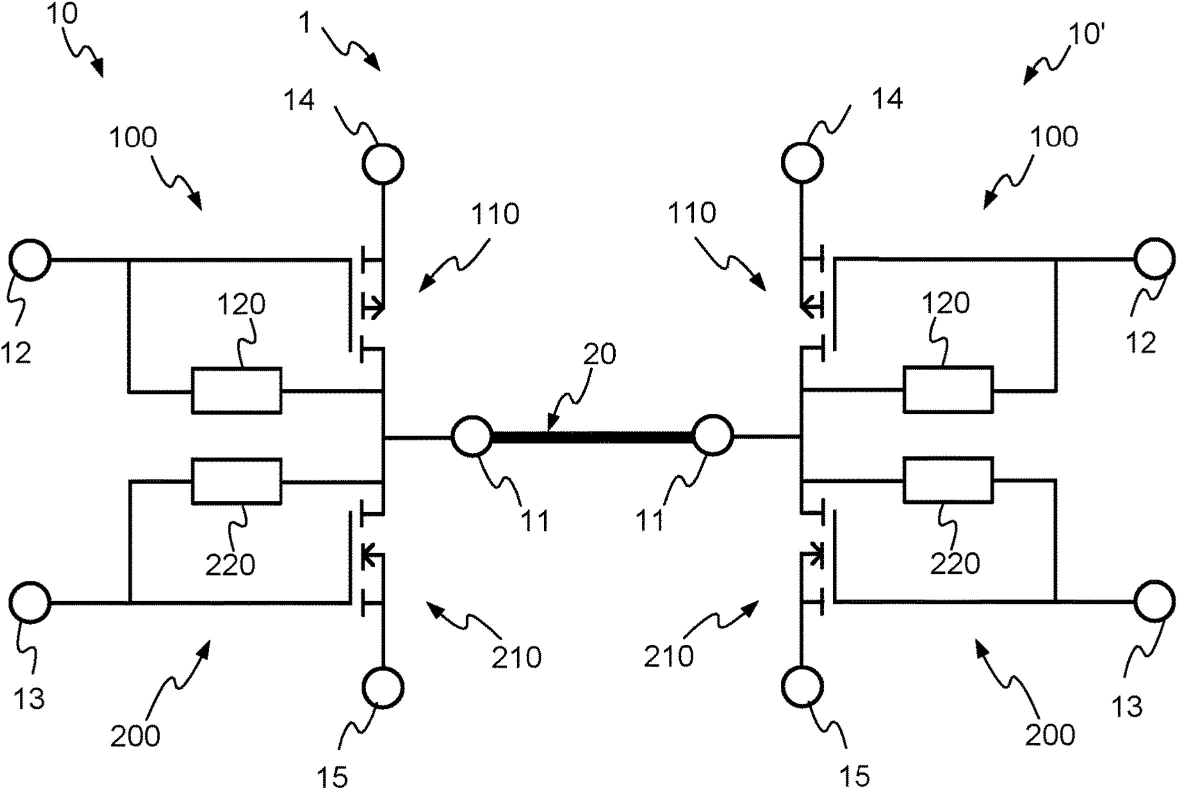
FIG. 11 is a simplified electric circuit diagram of an electric system according to some embodiments of the invention.

In FIG. 11, an electric system 1 according to an embodiment of the invention is shown. The electric system 1 may be considered a partial detailed view of the schematic view of the split RF front end of FIG. 2. The electric system 1 comprises a first interface port 10 and a second interface port 10'. In FIG. 11, these interface ports 10, 10' are illustrated as the embodiment described with reference to FIG. 8, but is should be noted that any of the interface ports 10, 10' may be any of the other embodiments of the bidirectional interface port 10 presented herein and that both interface ports 10, 10' are not required to be configured according to the same embodiment of the bidirectional interface port 10. In FIG. 11, a bidirectional interface 20 is arranged to connect the bidirectional terminal 11 of the first interface port 10 to the bidirectional terminal 11 of the second interface port 10'. The bidirectional interface 20 may comprise any suitable connection means such as wiring, cabling, routing etc. In a preferred embodiment, the bidirectional interface 20 is configured as a transmission line 20 which has a characteristic impedance $Z_T$. In a further embodiment, the characteristic impedance $Z_T$ correspond to the input impedances of respective bidirectional terminal 11 of the first and second interface ports 10, 10'. The transmission line 20 may be a stripline, a microstrip or a combination of a stripline and a microstrip connected by e.g. vias.

The electric system 1 formed by connecting two interface ports 10 of embodiments of the present invention has several benefits in view of the prior art. The linearity of the electric system is greatly improved, especially in communication paths wherein at least one feedback transconductance stage 120, 220 is configured as a passive element as disclosed herein. Further to this, the electric system 1 incorporates LPF functionality on both the transmitting and the receiving side, greatly increasing the filtering efficiency and making it less susceptible to noise or other interference. In addition to this, if each of the connected interface ports 10, 10' comprise a first impedance element 310 at their bidirectional ports 11, the connecting interface 20 will, assuming a non-ideal bidirectional interface 20, isolate the respective bidirectional ports 11. This effectively forms substantially independent complex poles at each side of the bidirectional interface 20 making it possible to dimension the electric system 1 as one unit and controlling the location of the respective complex poles such that e.g. reflections are minimized and effectivenesses of LPF filters are maximized. In other words, looking to transfer function H(s) of the system 1, each or the interface ports 10, 10' will present one complex pole pair providing a transfer function H(s) with fourth order filtering capabilities. It should be mentioned that, even in embodiments where the bidirectional interface 20 may be model as ideal, e.g. the interface ports 10, 10' are located close to one another, the transfer function H(s) will present a third order filter with one complex pole pair and one real pole.

As mentioned with reference to FIG. 2, the bidirectional interface ports 10 of the present disclosure may be comprised in an electric circuitry 410, 420. The electric circuitry 410, 420 may comprise more than one interface port. In a preferred embodiment, the electric circuitry 410, 420 is an Application Specific Integrated Circuit, ASIC, 410, 420. In such an embodiment, at least one bidirectional terminal 11 of the interface ports 10 comprised in the ASIC 410, 420 is operatively connected to an external connection of the ASIC 410, 420. This may be accomplished by wire bonding, fan-out layers or any other suitable technique that makes the bidirectional terminal 11 accessible from an outside of the ASIC 410, 420.

Figure 12:
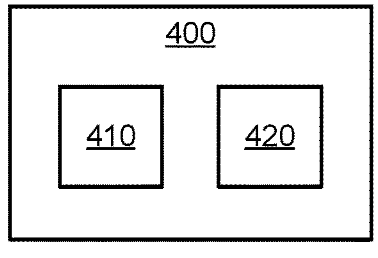
FIG. 12 is a block view of an electronic apparatus according to some embodiments of the invention.

As schematically illustrated in FIG. 12, one or more of the electric circuitry 410, 420 may be comprised in an electronic apparatus 400. In one embodiment, the electronic apparatus 400 is a wireless communication device for a cellular communication system. In an alternative embodiment, the wireless communication device is a radio base station for a cellular communication system.

Figure 13:
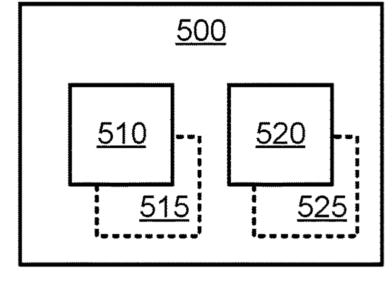
FIG. 13 is a block view of a method of controlling a bidirectional interface according to some embodiments of the invention.

The bidirectional interface 20 of embodiments of the present invention may be controlled by a method 500 illustrated in FIG. 13. The method may be performed by any suitable electronic apparatus 400 incorporating or operable to control the bidirectional interface 20. The method 500 may be performed by a controller comprised in the electronic apparatus 400. The controller is operatively connected to the electric circuitry 410, 420 comprising the interface ports 10 to be controlled by the method 500. The controller may be comprised in either of the electronic circuits 410, 420 or distributed between the electronic circuits 410, 420. The method 500 is operable to control the bidirectional interface 20 in two modes of operation. As a non-limiting example, FIG. 11 may be used to exemplify a first mode of operation which connects the input port 12 of the first interface port 10 to the output port 13 of the second interface port 10'. Correspondingly, a second mode of operation connects the input port 12 of the second interface port 10' to the output port 13 of the first interface port 10.

In the first mode of operation, the method 500 comprises enabling 510 the first active inductance 100 and disabling 520 the second active inductance 200 of the first interface port 10. This operatively connects the bidirectional terminal 11 of the first interface port 10 to the input terminal 12 of the first interface port 10. Correspondingly, the second interface port 10' is controlled by enabling 510 the second active inductance 200 and disabling 520 the first active inductance 100, operatively connecting the bidirectional terminal 11 of the second interface port 10' to the output port 13 of the second interface port 10'. As a consequence, the input terminal 12 of the first interface port 10 is operatively connected to the output terminal 13 of the second interface port 10' via the interface 20.

Similarly, in the second mode of operation, the method 500 comprises enabling 510 the first active inductance 100 and disabling 520 the second active inductance 200 of the second interface port 10'. This operatively connects the bidirectional terminal 11 of the second interface port 10' to the input terminal 12 of the second interface port 10'. Correspondingly, the first interface port 10 is controlled by enabling 510 the second active inductance 200 and disabling 520 the first active inductance 100, operatively connecting the bidirectional terminal 11 of the first interface port 10 to the output port 13 of the first interface port 10. As a consequence, the input terminal 12 of the second interface port 10' is operatively connected to the output terminal 13 of the first interface port 10 via the interface 20.

As previously disclosed, the step of enabling 510 may in some embodiments comprise a step of activating 515 the forward transconductance stage 110, 210 of the active inductor 100, 200. Additionally or alternatively, the step of disabling 520 may in some embodiments comprise a step of deactivating 525 the forward transconductance stage 110, 210 of the associated active inductor 100, 200.

The invention claimed is:

1. An interface port for a bidirectional interface comprising:

an input terminal operatively connected to an input of a first active inductor;

an output terminal operatively connected to an output of a second active inductor; and a bidirectional terminal operatively connected to an output of the first active inductor and to an input of the second active inductor, wherein each of the first and second active inductors respectively comprises a forward transconductance stage and a feedback transconductance stage, wherein the forward transconductance stage of the first active inductor is configured to rotate a signal provided at the input terminal 180° before the signal arrives at the output terminal.

2. The interface port of claim 1, wherein the feedback transconductance stage of the first active inductor is a passive feedback transconductance stage, and/or the feedback transconductance stage of the second active inductor is a passive feedback transconductance stage.

3. The interface port of claim 2, wherein the feedback transconductance stage of the first active inductor is a passive feedback transconductance stage, and the feedback transconductance stage of the second active inductor is a passive feedback transconductance stage.

4. The interface port of claim 2, wherein the passive feedback transconductance stage is a resistor.

5. The interface port of claim 2, wherein the forward transconductance stage of the first active inductor is a p-channel MOSFET based circuitry and the forward transconductance stage of the second active inductor is an n-channel MOSFET based circuitry.

6. The interface port of claim 1, further comprising a substantially capacitive first impedance element operatively connected in parallel to the bidirectional terminal.

7. The interface port of claim 6, wherein the first impedance element, the second impedance element, and the third impedance element have substantially the same impedance.

8. The interface port of claim 1, further comprising a substantially capacitive second impedance element operatively connected in parallel to the input terminal.

9. The interface port of claim 1, further comprising a substantially capacitive third impedance element operatively connected in parallel to the output terminal.

10. The interface port of claim 1, further comprising a fourth impedance element operatively connected in parallel between the input terminal and the output terminal.

11. An electric circuitry comprising the interface port of claim 1.

12. The electric circuitry of claim 11, wherein the electric circuitry is an Integrated Circuit (IC), and at least one bidirectional terminal of the interface port is operatively connected to an external connection of the IC.

13. An electronic apparatus comprising the electric circuitry of claim 11.

14. The electronic apparatus of claim 13, wherein the electronic apparatus is a wireless communication device for a cellular communication system, or the electronic apparatus is a radio base station for the cellular communication system.

15. An electric system, comprising:

a first interface port comprising:

a first input terminal operatively connected to an input of a first active inductor comprising a first forward transconductance stage and a first feedback transconductance stage;

an first output terminal operatively connected to an output of a second active inductor comprising a second forward transconductance stage and a second feedback transconductance stage; and a first bidirectional terminal operatively connected to an output of the first active inductor and to an input of the second active inductor;

a second interface port port comprising:

a second input terminal operatively connected to an input of a third active inductor comprising a third forward transconductance stage and a third feedback transconductance stage;

a second output terminal operatively connected to an output of a fourth active inductor comprising a fourth forward transconductance stage and a fourth feedback transconductance stage; and a bidirectional terminal operatively connected to an output of the third active inductor and to an input of the fourth active inductor; and a bidirectional interface, wherein the bidirectional interface is arranged to electrically connect the first bidirectional terminal of the first interface port to the second bidirectional terminal of the second interface port.

16. The electric system of claim 15, wherein the bidirectional interface is a transmission line.

17. The electric system of claim 16, wherein the transmission line comprises a microstrip and/or a stripline.

18. A method of controlling a bidirectional interface connecting a first bidirectional terminal of a first interface port to a second bidirectional terminal of a second interface port, wherein the method comprises:

entering a first mode of operation, wherein entering the first mode of operation comprises:

enabling a first active inductor of the first interface port, wherein the first active inductor comprises a first forward transconductance stage and a first feedback transconductance stage;

disabling a second active inductor of the first interface port, wherein the second active inductor comprises a second forward transconductance stage and a second feedback transconductance stage;

enabling a third active inductor of the second interface port, wherein the third active inductor comprises a third forward transconductance stage and a third feedback transconductance stage; and disabling a fourth active inductor of the second interface port, wherein the fourth active inductor comprises a fourth forward transconductance stage and a fourth feedback transconductance stage; and entering a second mode of operation, wherein entering the second mode of operation comprises:

disabling the first active inductor of the first interface port;

enabling the second active inductor of the first interface port;

disabling the third active inductor of the second interface port; and enabling the fourth active inductor of the second interface port.

19. The method of claim 18, wherein the step of enabling comprises activating the forward transconductance stage of the associated active inductor.

20. The method of claim 18, wherein the step of disabling comprises deactivating the forward transconductance stage of the associated active inductor.

* * * * *